(12) United States Patent
Nishiyama

(10) Patent No.: US 7,711,021 B2
(45) Date of Patent: May 4, 2010

(54) LASER DRIVER CIRCUIT ABLE TO COMPENSATE A TEMPERATURE DEPENDENCE OF THE LASER DIODE

(75) Inventor: Naoki Nishiyama, Yokohama (JP)

(73) Assignee: Sumitomo Electric Industries Ltd., Osaka (JP)

( * ) Notice: Subject to any disclaimer, the term of this patent is extended or adjusted under 35 U.S.C. 154(b) by 45 days.

(21) Appl. No.: 11/806,473

(22) Filed: May 31, 2007

(65) Prior Publication Data

US 2007/0297472 A1 Dec. 27, 2007

(30) Foreign Application Priority Data

Jun. 2, 2006 (JP) ............................. 2006-154901

(51) Int. Cl.
*H01S 3/00* (2006.01)
(52) U.S. Cl. .................. 372/38.02; 372/29.01; 372/34; 372/38.1; 372/38.07; 372/29.011
(58) Field of Classification Search .............. 372/38.02, 372/34, 29
See application file for complete search history.

(56) References Cited

U.S. PATENT DOCUMENTS 5,297,181 A * 3/1994 Barr et al. ................... 375/373
5,302,922 A * 4/1994 Heidemann et al. ........... 333/18
5,378,937 A * 1/1995 Heidemann et al. ......... 327/306
6,122,085 A * 9/2000 Bitler .......................... 398/193
2002/0101641 A1* 8/2002 Kurchuk ...................... 359/189

FOREIGN PATENT DOCUMENTS

| JP | 60-187075 | | 9/1985 |
|---|---|---|---|
| JP | 2003-198046 | * | 7/2003 |
| JP | 2003-273448 | * | 9/2003 |
| JP | 2006-158177 | * | 6/2006 |

* cited by examiner

*Primary Examiner*—Minsun Harvey
*Assistant Examiner*—Delma R Forde
(74) *Attorney, Agent, or Firm*—Smith, Gambrell & Russell, LLP

(57) ABSTRACT

The present invention provides a laser diode driving circuit able to reduce the degradation of the optical output from the laser diode even when the characteristic of the laser diode widely scatters. The circuit provides a filter circuit connected in parallel to the laser diode that compensates the frequency dependence of the laser diode. In the invention, the frequency characteristic of this filter circuit may be varied depending on the scattering in the frequency response of the laser diode, or on the temperature characteristic of the diode.

6 Claims, 9 Drawing Sheets

LASER DRIVER CIRCUIT ABLE TO COMPENSATE A TEMPERATURE DEPENDENCE OF THE LASER DIODE

BACKGROUND OF THE INVENTION

1. Field of the Invention

The present invention relates to a driving circuit for a semiconductor laser diode (LD), in particular, the invention relates to a driver to suppress the degradation of the quality of the optical output.

2. Related Prior Art

Various driver circuits for a semiconductor laser diode (herein after denoted as LD) have been known. The LD shows a time lag from the injection of the carriers into the active laser thereof to the emission of the coherent light, which corresponds to the resonance frequency of the LD. Accordingly, when the LD is driven with a high frequency signal, the interference may occur between data due to the resonance of the signal applied thereto and the time lag of the LD. A Japanese Patent published as JP-S60-187075A has disclosed a typical conventional driver for the LD to compensate the frequency response of the LD where the circuit provides an additional circuit connected in parallel to the LD. The circuit disclosed in the prior patent includes a series circuit of a capacitor and a resistor, a parallel circuit of a diode and a capacitor, or a combination of a series circuit of a resistor and a capacitor and a parallel circuit of a diode and a capacitor. Such additional circuit may compensate the high frequency response of the LD.

However, the conventional driver carries out the compensation for the frequency response of the LD by a combination of resistor, capacitor, and diode each showing constant value. This is due to a reason that such elements applicable in the compensation circuit are necessary to show an excellent high frequency characteristic.

However, the LD itself and elements used in the driving circuit have inherently scattered characteristics, and it is necessary to replace elements to follow the frequency response of respective LDs when the circuit applies such elements with the constant value. Moreover, the LD generally shows strong temperature dependence in its frequency response. Accordingly, such circuit elements occasional is unable to compensate the frequency response of the LD.

The present invention is to provide a driving circuit for the LD, in which the scattering of the frequency characteristic of respective LDs and the temperature dependence of the LD may be compensated enough.

SUMMARY OF THE INVENTION

The present invention has a feature that includes a filter circuit and a controller. The filter circuit is connected in parallel to the semiconductor laser diode. The controller controls a frequency response of the filter circuit to compensate the characteristic of the laser diode. The driving circuit according to the present invention may suppress the overshoot and the undershoot appeared in the optical output from the LD even if the characteristic of the LD scatters individually or the LD shows strong temperature dependence in the optical output thereof.

The filter circuit may include a resistor and a capacitor with variable capacitance. The capacitor may be a reversely biased diode whose junction capacitance varies as the bias voltage applied thereto varies. In the present invention, the reverse bias voltage of the diode may be controlled by the controller so as to compensate the frequency response of the laser diode.

In another configuration of the driver circuit according to the present invention, the filter circuit may include a variable resistive element and a capacitor with the constant capacitance connected in serial to the variable resistive element. To vary the resistance of the variable resistive element may change the frequency characteristic of the filter circuit, accordingly, may compensate the frequency response of the laser diode.

The controller of the present invention may include a temperature sensor that senses a operating temperature of the laser diode, and the controller may control the frequency characteristic of the filter circuit so as to compensate the frequency response of the laser diode based on the temperature sensed by the temperature sensor.

BRIEF DESCRIPTION OF DRAWINGS

FIG. 3A shows an optical output from the LD obtained at −10[° C.], while

DESCRIPTION OF PREFERRED EMBODIMENTS

Next, preferred embodiments according to the present invention will be described as referring to accompanying drawings. In the description of drawings, the same numerals or the same symbols will refer to the same elements without overlapping explanations.

First Embodiment

Figure 1:
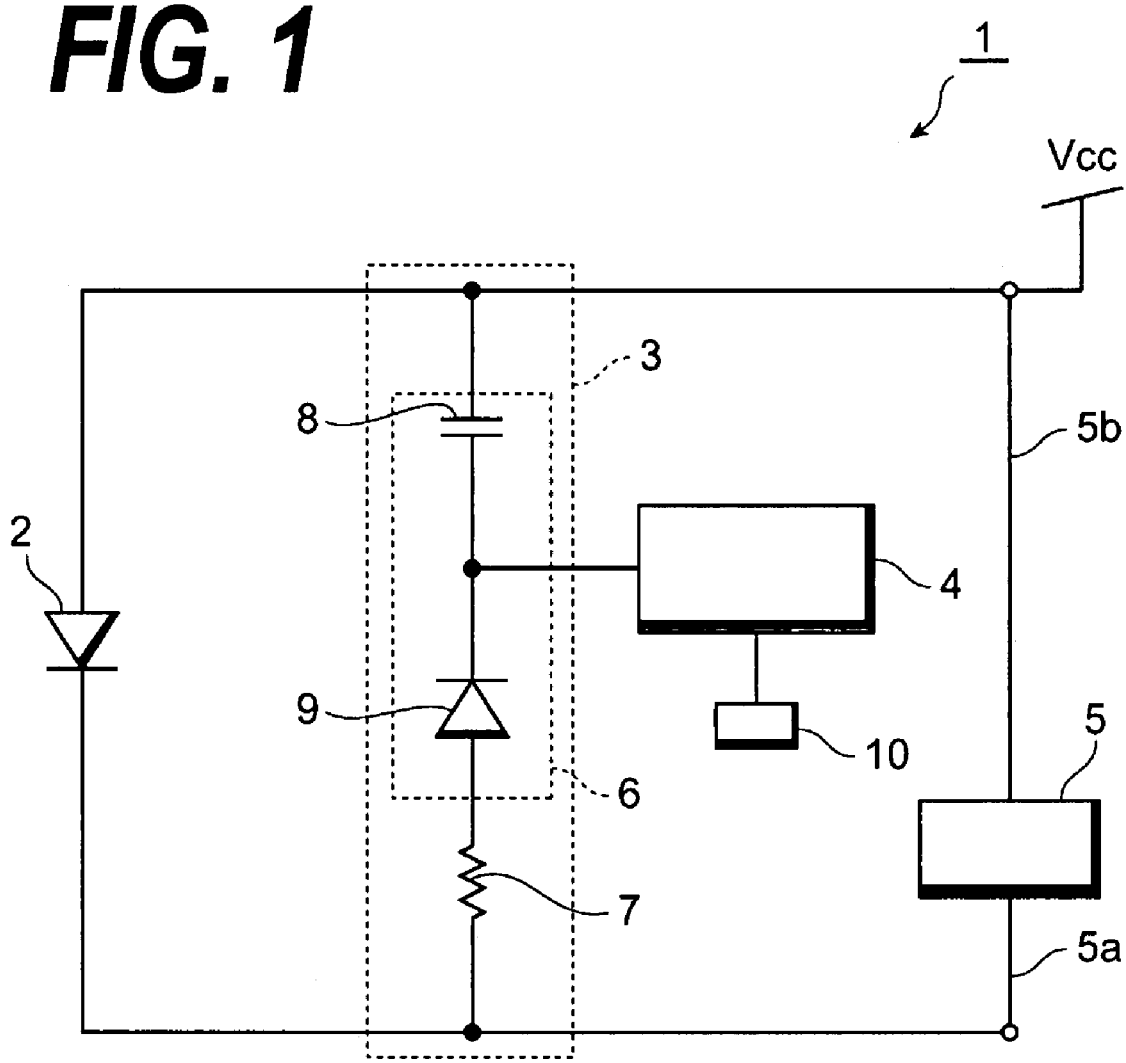
FIG. 1 is a circuit diagram of an LD-driver according to the first embodiment of the invention.

FIG. 1 is a circuit diagram of a laser driver 1 (denoted as LD driver) according to the first embodiment of the invention. The LD driver 1, which is installed within an optical transmitter applied for the optical communication, is a circuit for driving a semiconductor laser diode to generate an optical signal modulated in the amplitude thereof. The LD-driver 1 includes a filter circuit 3, which is connected in parallel to the LD 2 to absorb high frequency components in the current generated by the LD 2, a controller 4 to adjust the frequency characteristic of the filter circuit 3, and a signal generator 5. The cathode of the LD 2 is guided to a terminal 5a of the signal generator 5 for the normal phase, while the anode of the LD 2 is guided to the other terminal 5b of the signal generator 5 for the opposite phase and also connected to the power supply Vcc. The signal generator 5 generates pulsed currents with high frequency components and having the normal phase and the opposite phase.

The filter circuit 3 includes a capacitive element 6, one terminal of which is connected to the anode of the LD 2, and a resistive element 7 with the resistance of $R_1$ connected in serial to the capacitive element 6. Specifically, the capacitive element 6 includes a capacitor 8 with a capacitance of $C_1$, one terminal of which is connected to the anode of the LD 2, and a variable capacitance diode, which is often denoted as varactor, whose cathode is connected to the capacitor 8 while the anode thereof is connected to the resistive element 7.

Figure 2:
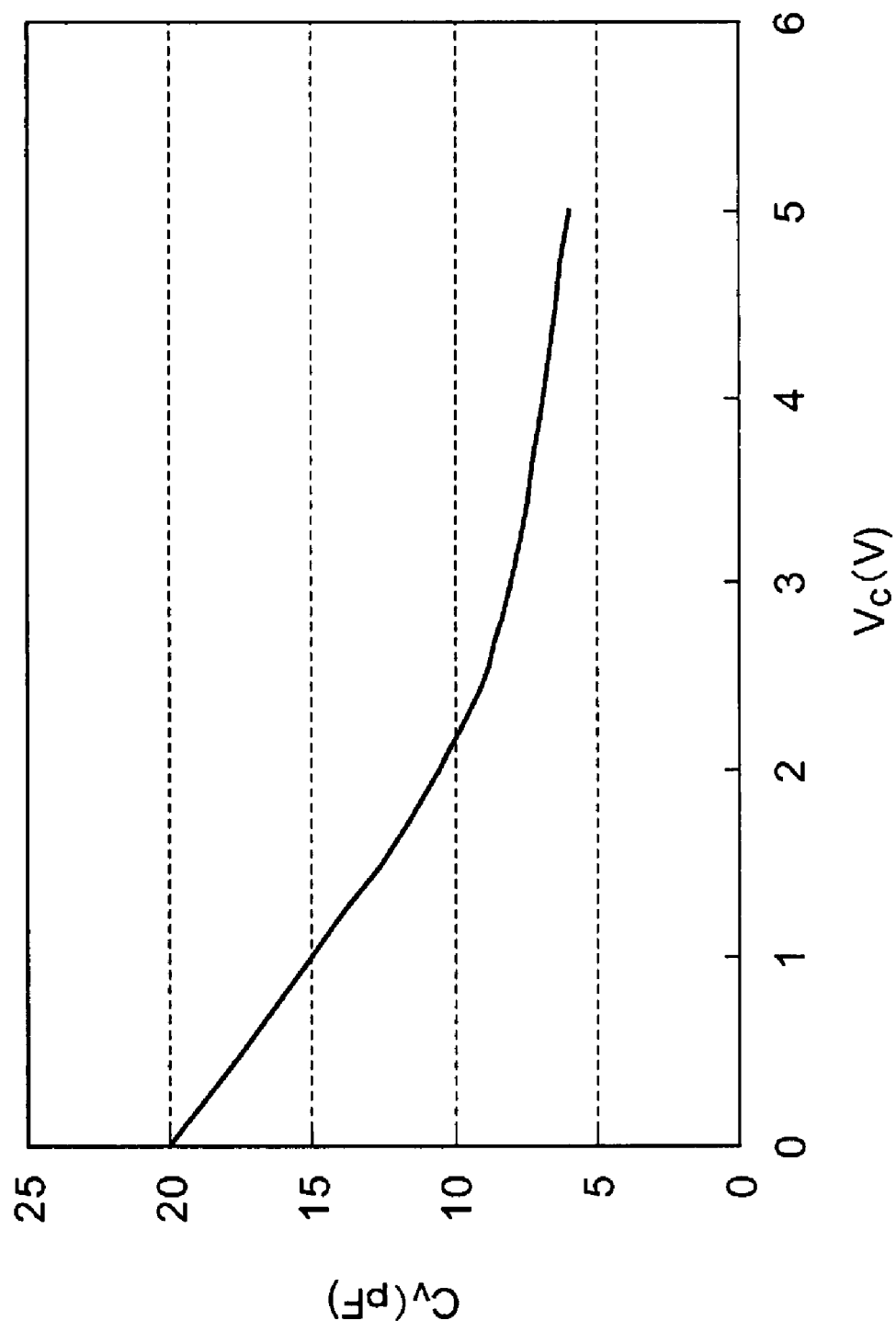
FIG. 2 illustrates a relation between the capacitance and the bias voltage of the varactor shown in FIG. 1.

The varactor 9 is a circuit element able to vary its junction capacitance $C_V$ depending on a bias voltage applied between the anode and the cathode thereof, that is, the varactor is a voltage-controlled capacitive element. FIG. 2 shows a relation between the reverse bias voltage $V_C$ of the varactor and the capacitance $C_V$ appeared between two terminals thereof. As shown in the relation, the capacitance $C_V$ of the varactor 9 monotonically decreases as increasing the reverse bias voltage $V_C$.

The cathode of the varactor 9 receives the output of the controller 4, which may include a digital-to-analog converter. Thus, the controller 4 may adjust the junction capacitance of the varactor 9 by varying the reverse bias voltage of the varactor 9. For instance, assuming the output of the controller 4 is $V_{cc}$−0.8 [V] and the forward voltage of the LD 2 is 1.5 [V] due to driving current flowing between the anode and the cathode thereof, then the reverse bias voltage of the varactor 9 becomes about 0.7 [V], whereby the varactor 9 with a characteristic illustrated in FIG. 2 shows the junction capacitance $C_V$ of about 17 [pF]. The filter circuit 3 including such varactor 9 may vary its frequency response because the junction capacitance $C_V$ which is connected in serial to the resistive element 7 may be varied.

The capacitive element 6 in the filter circuit 3 includes the varactor 9 and the capacitor 8 whose capacitance C1 is set to be far greater than that of the varactor 9, for example, the capacitance C1 is typically 1000 [pF] whereas the junction capacitance of the varactor is about 17 [pF] at a room temperature. In the case the filter circuit 3 includes the resistive element 7 and only the varactor 9, the capacitance of the varactor 9 becomes unable to vary its junction capacitance because the forward voltage of the LD is substantially fixed by the driving current. To connect the capacitor 8 between the anode of the LD 2 and the varactor 9 to cut a DC component of driving signal enables to vary the reverse bias voltage for the varactor 9. Moreover, to set the capacitance C1 of the capacitor far greater than the junction capacitance $C_V$ of the varactor 9 substantially decides the capacitance of the filter circuit 6 to be that of the capacitor 8. Thus, the capacitor 8 shows nearly no function for the filter circuit 3.

The controller 4 connects a temperature sensor 10 such as thermistor to monitor a temperature of the LD 2. The controller 4 sets its output, which is applied to the varactor 9 as the reverse bias voltage thereof, depending on the temperature monitored by the sensor 10, that is, the output of the controller 4 is so set that the filter circuit 6 compensates the temperature dependence of the LD 2.

The LD-driver 1 thus described compensates the frequency characteristic of the LD 2, in particular, the response in high frequencies of the LD 2 such as an overshoot or an undershoot occurred at a rising edge and a falling edge of the driving signal may be improved, which suppresses the inter symbol interference of the LD 2. This compensation in the optical output may be adjustable by using a variable capacitance device 9. Accordingly, even the LD 2 inherently shows the dispersion in the frequency response thereof or the LD 2 changes its response as varying the temperature thereof, the filter circuit 6 may compensate such dispersion and the change.

Figure 3A:
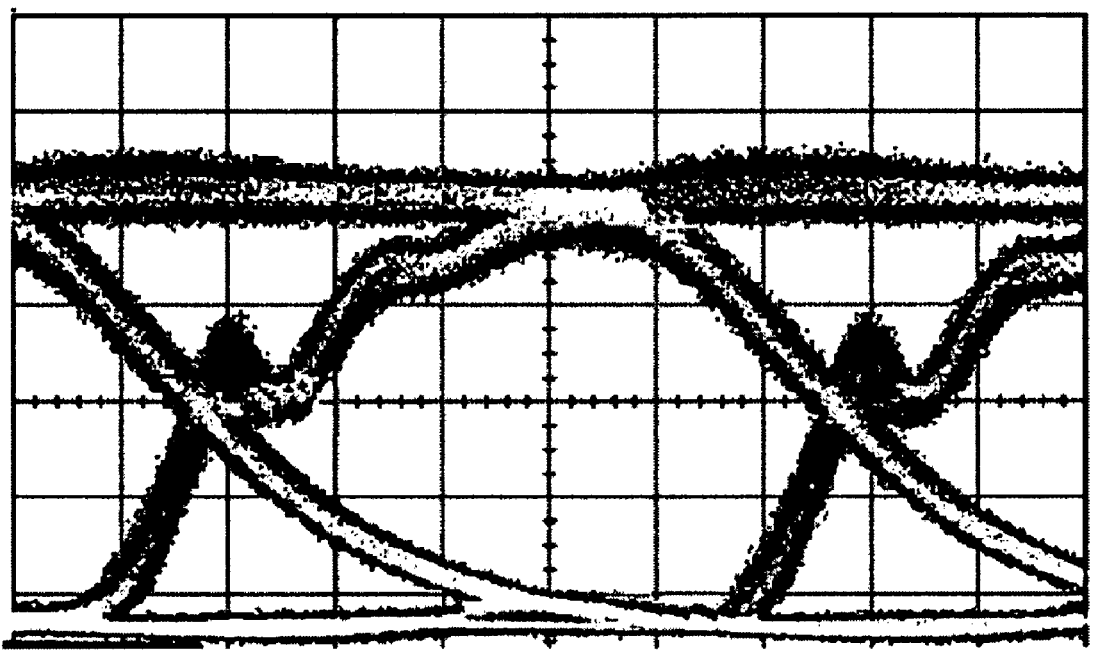
Figure 3B:
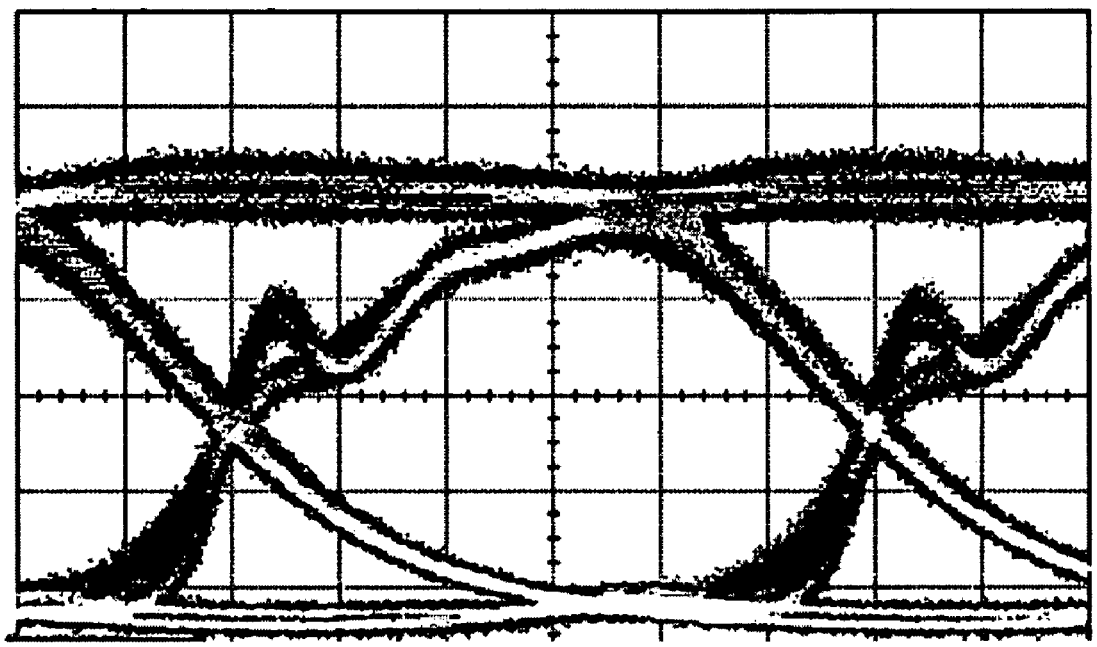
FIG. 3B is a result obtained at 65[° C.]
Figure 4:
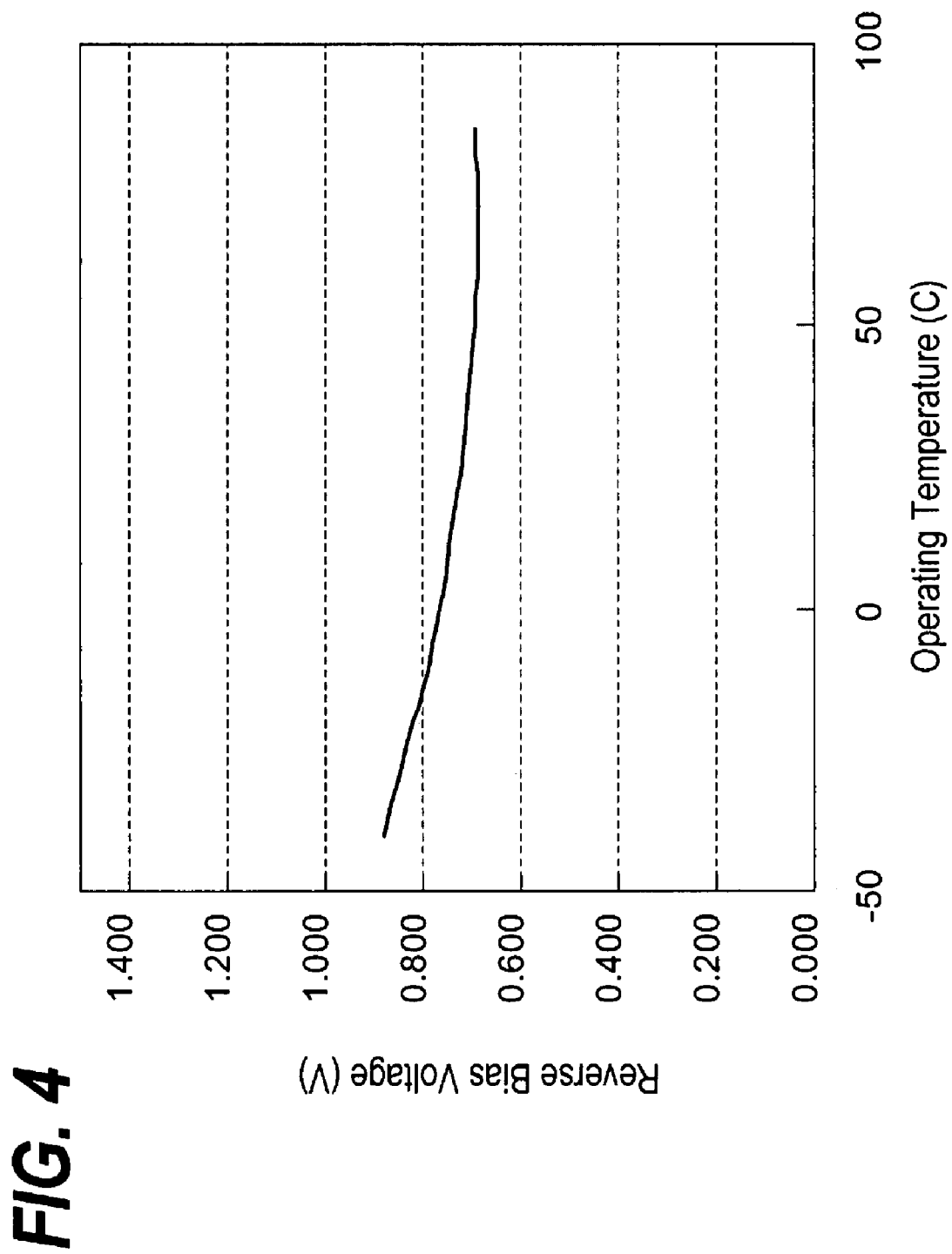
FIG. 4 shows a temperature dependence of the reverse bias voltage of the varactor shown in FIG. 1.

FIGS. 3A and 3B show typical examples of the optical output from the LD 2, where FIG. 3A shows the output at the temperature of the LD is −10[° C.], while, FIG. 3B corresponds to the temperature thereof is 65[° C.]. In these figures, the resistance $R_1$ of the resistive element 7 and the bit rate of the transmission signal were 30 [O] and 2.48832 [Gbps], respectively, and the LD 2 was driven by a pseudo random signal with 23 stages. The varactor was so controlled that the junction capacitance $C_V$ thereof became 15 [pF] at −10[° C.], while it became 18 [pF] at 65[° ]. Thus, the LD-drive 1 may control the LD 2 to show a satisfactory optical output without substantial overshoots or undershoots even when the temperature of the LD 2 varies. FIG. 4 shows a characteristic of the reverse bias voltage of the varactor 9 when the optical outputs shown in FIGS. 3A and 3B were measured.

Second Embodiment

Figure 5:
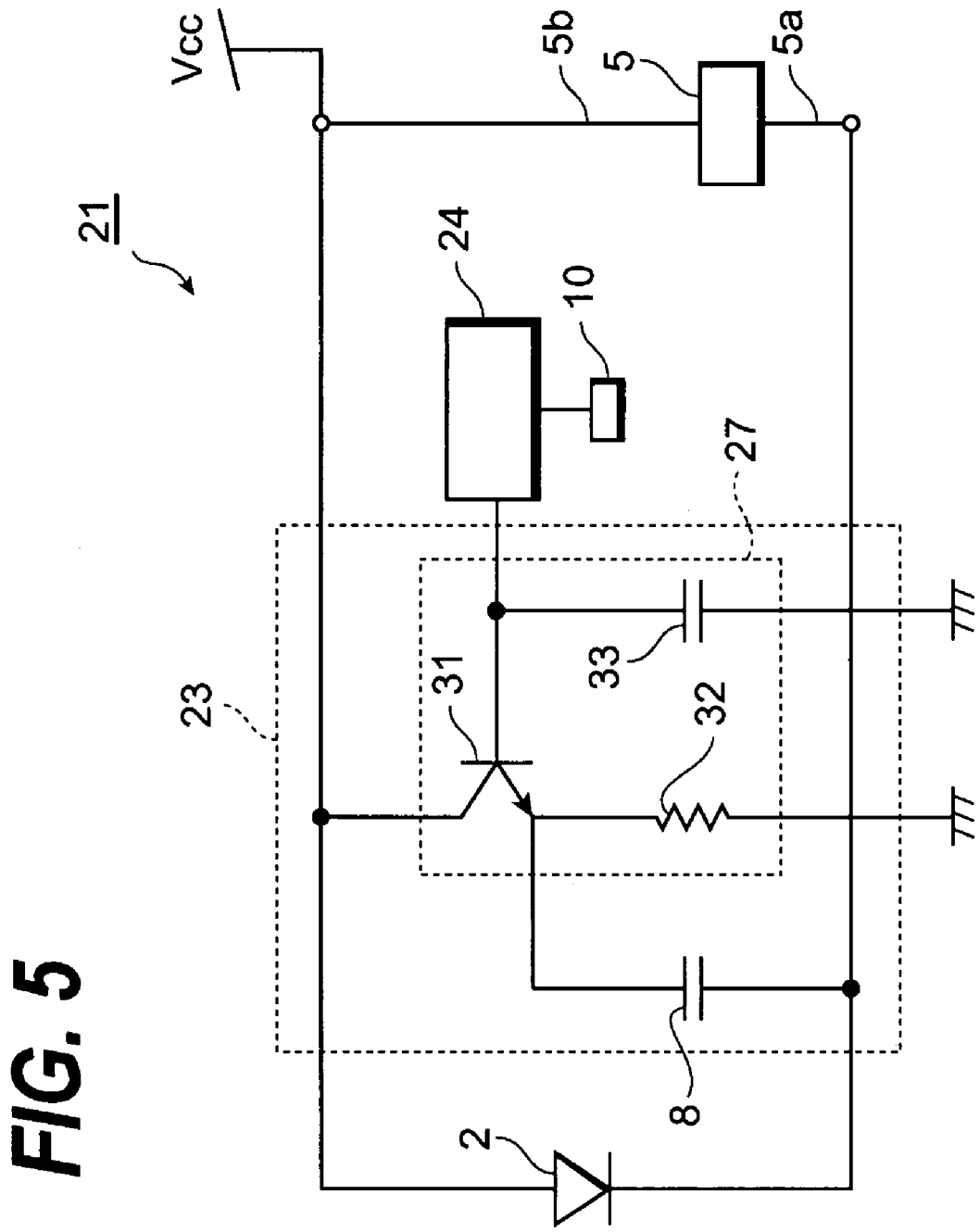
FIG. 5 is a circuit diagram of an LD-driver according to the second embodiment of the invention.

FIG. 5 shows a circuit diagram of an LD-driver 21 according to the second embodiment of the present invention. In the LD-driver 21 shown in FIG. 5, the filter circuit 23 connected in parallel to the LD 2 includes a resistive element 27 with variable resistance, which is an emitter follower of a transistor, and a capacitor 8 with capacitance $C_1$ connected in serial to the emitter of the transistor 31.

That is, the resistive element 27 includes an non-transistor 31, a resistor 32 with resistance R2 and a capacitor 33 with capacitance $C_2$. The collector of the transistor 31 is connected to the anode of the LD 2, the output terminal 5b of the signal generator 5 that outputs a signal with the opposite phase, and the positive power supply $V_{CC}$. While, the emitter of the transistor is connected to the capacitor 8, and the base thereof is to the controller 24. Between the emitter of the transistor 31 and the ground is provided with a resistor 32, and between the base and the ground is provided with a capacitor 33.

This resistive element 27, which is an emitter follower circuit, is regarded as a variable resistor constituting the filter circuit 23. A control signal provided from the controller 24 into the emitter follower varies the resistance between the collector and the emitter, that is, the transistor 31 may control the current flowing between the collector and the emitter by the signal applied to the base. For instance, setting $C_1$=16 [pF], R2=2.2 [kO], and the output of the controller 24 to be 2.7 [V], the current of about 1 [mA] flows in the transistor 31. Then, the resistance Re of the transistor appeared in the emitter thereof is given by:

$$Re = kT/(q \cdot Ie),$$

where k, T and q are the Boltzmann constant, the temperature in Kelvin and the electric charge, respectively. Accordingly, the resistance becomes Re=26 [O]. Setting the capacitance $C_2$ of the capacitor 33 to be 0.01 [μF] and neglecting the output impedance $R_O$ of the controller 24 is given by;

$$Z_o = Re + (R_b + R_o)/(1+\beta),$$

where $R_b$ and $\beta$ are the base resistance and the current amplification factor of the transistor, respectively. Assuming Rb=400 [O] and β=100, the output impedance $Z_o$ becomes $Z_o$=26+400/(1+100)~30 [O]. Varying the output from the controller 24 in a range from 2.0 [V] to 3.3 [V], the emitter resistance Re of the transceiver may vary from 20.4 [O] to 38.2 [O], which also varies the output impedance from 24.4 [O] to 42.4[O].

The controller 24 sets its output, which is applied to the base of the transistor 31, based on the temperature sensed by the temperature sensor 10 to adjust the output impedance $Z_o$.

Then, the controller 24 outputs the control signal such that the filter circuit 3 compensates the temperature dependence of the LD 2.

Thus, the LD-driver 21 according to the present embodiment may operate the emitter follower as the variable resistance circuit that changes its output resistance depending on the control signal provided from the controller 4, which changes the frequency characteristic of the filter circuit 23 so as to compensate the characteristic of the LD 2.

Figure 6:
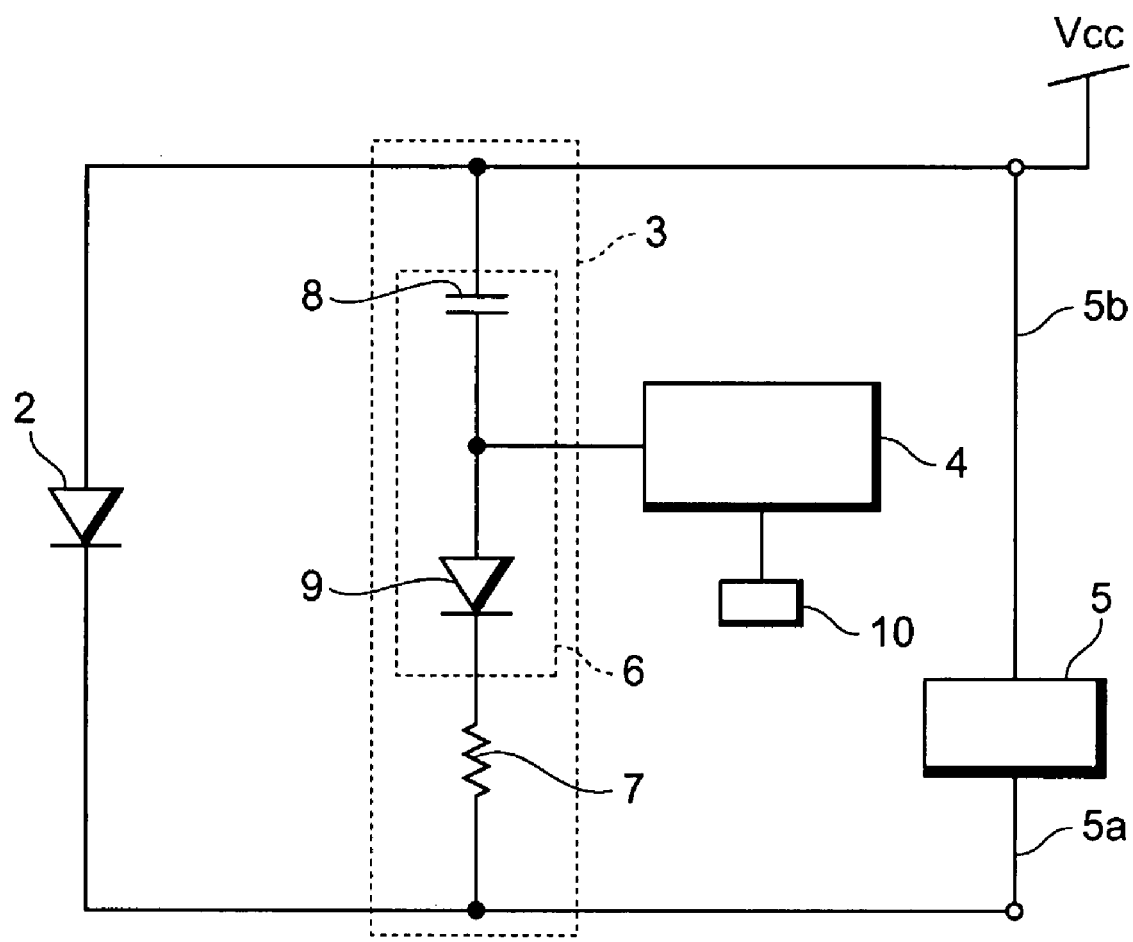
FIG. 6 is a modified circuit diagram of the LD-driver shown in FIG. 5.

The present invention is not restricted to those exemplarily disclosed embodiments. For example, the varactor 9 in the LD-driver 1 may be reversely connected as shown in FIG. 6. Depending on the power supply of the LD-driver 1 or the configuration of the signal generator 5, the cathode potential of the varactor 9 may be lowered to that of the LD 2. The varactor 9 reversely connected thereto may prevent the current from forwardly flowing in the varactor 9.

Figure 7:
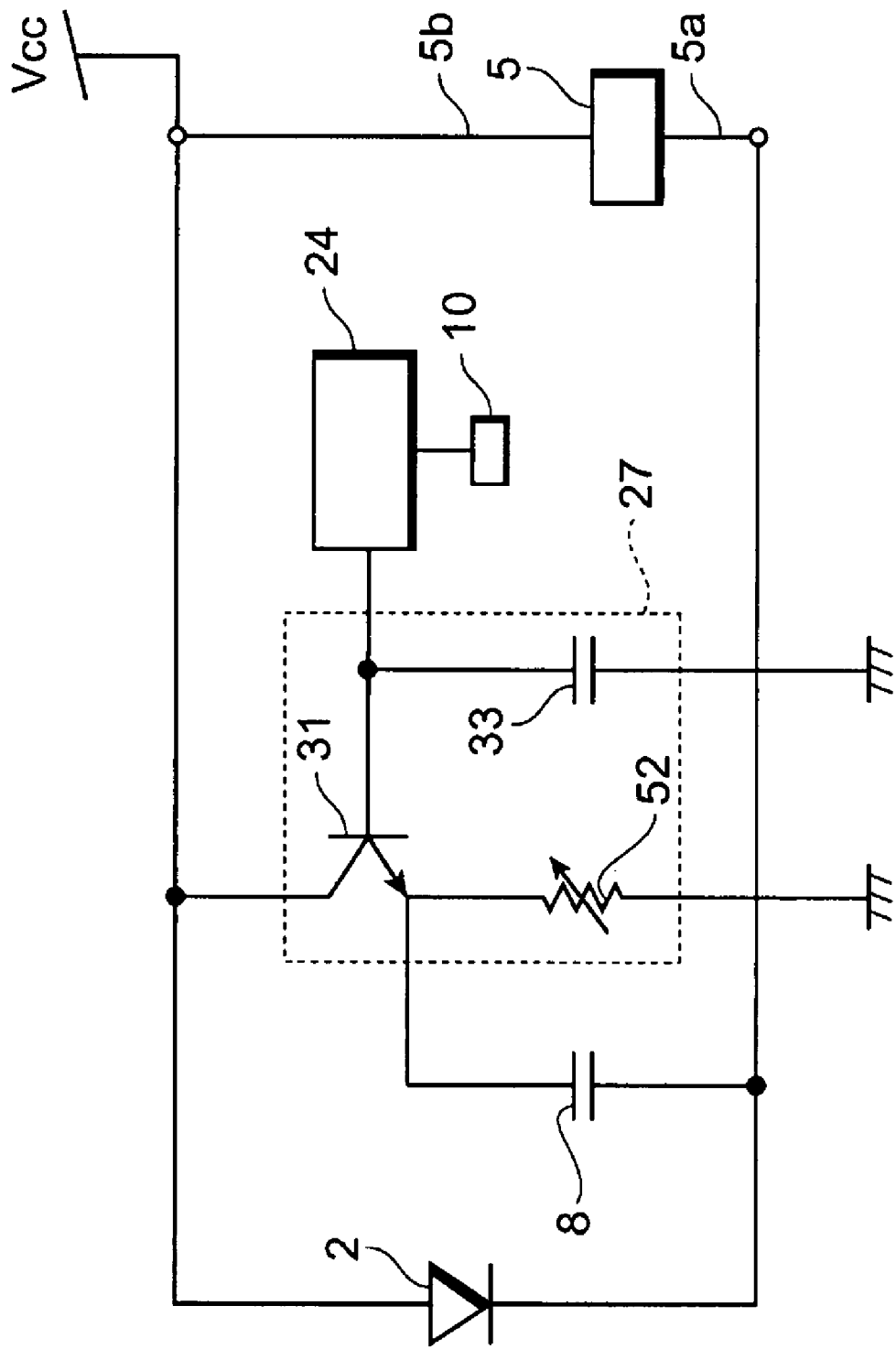
FIG. 7 is another modified circuit diagram of the LD-driver shown in FIG. 5.
Figure 8:
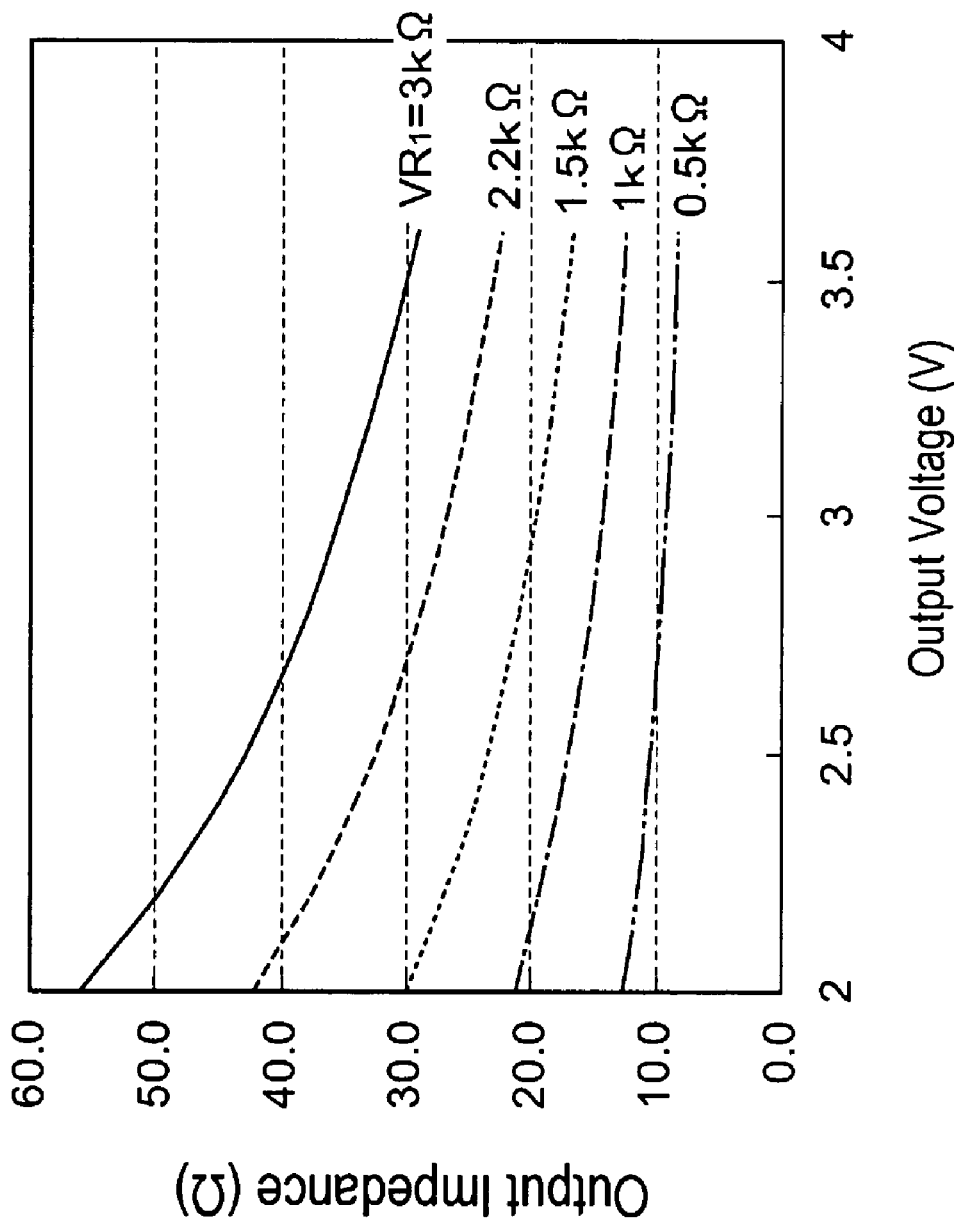
FIG. 8 illustrates a behavior of the output impedance of the filter circuit on the output provided from the controller in the LD-driver shown in FIG. 5.
Figure 9:
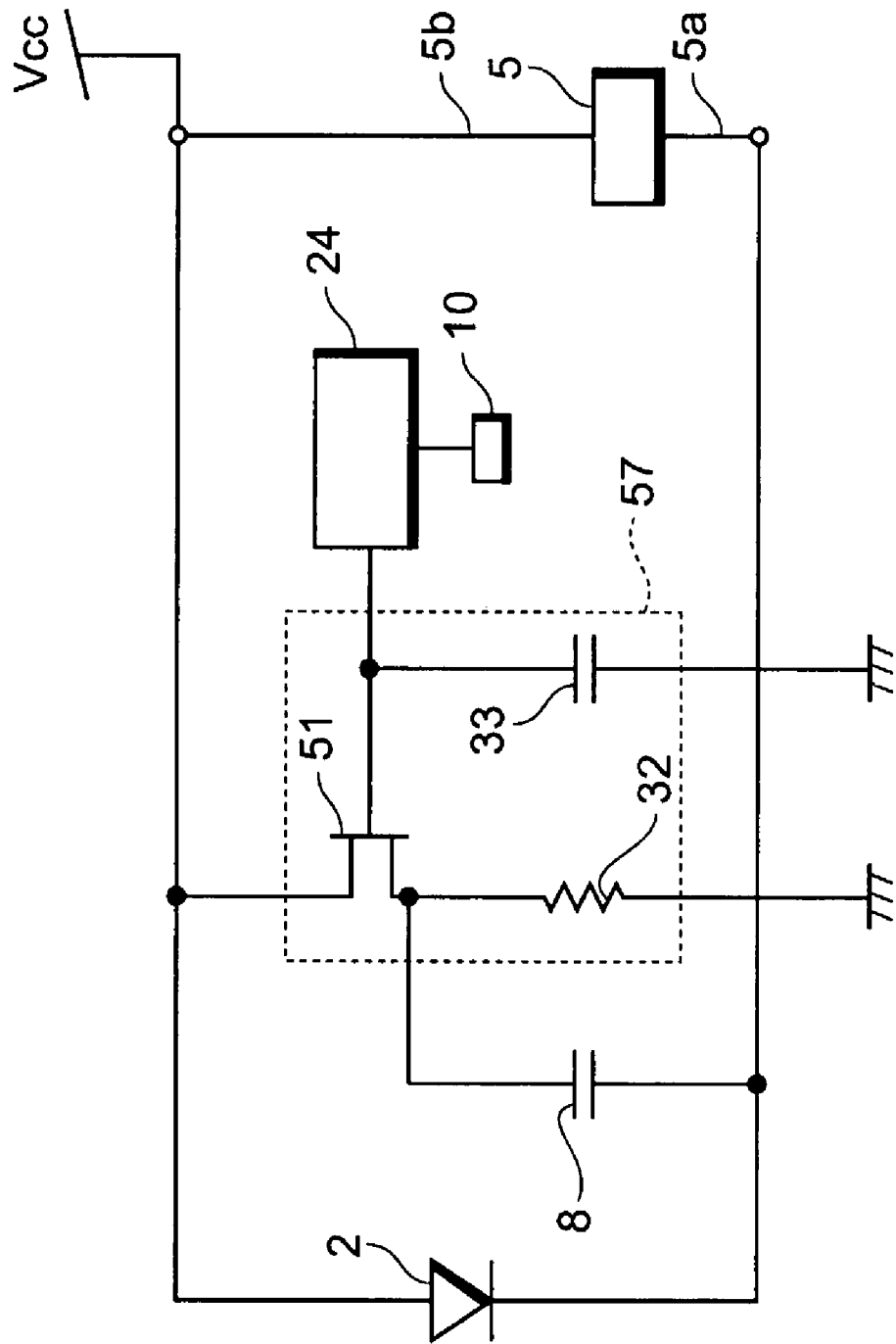
FIG. 9 shows still further modified circuit of the LD-driver shown in FIG. 5.

The variable resistive circuit may include a variable resistor 52 shown in FIG. 7 between the emitter and the ground, which expands a variable range of the emitter current Ie, accordingly, the range of the emitter resistance thereof. FIG. 8 illustrates behaviors of the output impedance $Z_o$ with respect to the control signal provided from the controller 24 by the resistance VR1 of the variable resistor 52 as a parameter.

Moreover, the transistor involved in LD-driver 21 may be one of MOSFET, MESFET, and J-FET. In such configuration, the drain of the FET 51 is connected to the anode of the LD 2, the signal terminal 5b for the opposite phase, and the positive power supply $V_{CC}$, the source of the FET 51 is connected to the capacitor 8 and the resistor 32, and the gate thereof is to the controller 24. The variable resistive element 57 operates as a source follower circuit, where the control signal is provided from the controller 24 to adjust the output impedance thereof, because the FET may vary the current flowing between the drain and the source by the signal applied to the gate thereof.

What is claimed is:

1. A driver circuit for a semiconductor laser diode, comprising:
    a filter circuit connected in parallel with the laser diode, the filter circuit including a resistor, a reversely biased varactor diode having a variable capacitance and connected in series with the resistor, and a capacitor with constant capacitance connected in series with the reversely biased varactor diode;
    a power supply;
    a signal generator to generate a signal for driving the laser diode, wherein the signal generator, the filter circuit and the laser diode are connected in parallel with respect to each other and are each connected in series with the power supply; and
    a controller for controlling a value of capacitance of the varactor diode by adjusting a bias voltage applied thereto to control a frequency response of the filter circuit, the controller being connected with a node between the varactor diode and the capacitor to be isolated from the power supply in a direct current mode by the capacitor,
    wherein the reversely biased varactor diode is controlled in junction capacitance thereof by the controller.

2. A driver circuit for a semiconductor laser diode, comprising:
    a power supply;
    a signal generator;
    a filter circuit including a resistor, a varactor connected in series with the resistor and a capacitor connected in series with the varactor;
    the signal generator, the filter circuit and the laser diode being connected in parallel with respect to each other and each being connected in series with the power supply; and
    a controller for controlling a value of capacitance of the varactor by adjusting a bias voltage applied to the varactor, the controller being connected with a node between the varactor and the capacitor, the controller being isolated from the power supply in a direct current mode by the capacitor,
    wherein the filter circuit compensates frequency response of the laser diode.

3. The driver circuit according to claim 2,
    further including a temperature sensor connected with the controller, the temperature sensor sensing a temperature of the laser diode,
    wherein the filter circuit compensates temperature dependence of the laser diode by controlling a bias voltage by the controller based on the temperature of the laser diode sensed by the temperature sensor.

4. The driver circuit according to claim 2,
    wherein the capacitor has a value of capacitance far greater than a value of capacitance of the varactor.

5. The driver circuit according to claim 1,
    further including a temperature sensor connected with the controller, the temperature sensor sensing a temperature of the laser diode,
    wherein the controller compensates temperature dependence of the laser diode by controlling a bias voltage of the varactor diode based on the temperature of the laser diode sensed by the temperature sensor.

6. The driver circuit according to claim 1,
    wherein the capacitor has a value of capacitance far greater than a value of capacitance of the varactor diode.

* * * * *